United States Patent
Lee et al.

(10) Patent No.: US 12,199,218 B2
(45) Date of Patent: Jan. 14, 2025

(54) OPTOELECTRONIC SEMICONDUCTOR COMPONENT AND METHOD FOR PRODUCING AN OPTOELECTRONIC SEMICONDUCTOR COMPONENT

(71) Applicant: OSRAM Opto Semiconductors GmbH, Regensburg (DE)

(72) Inventors: Ee Lian Lee, Penang (MY); Boon Liang Yap, Penang (MY); Prakash Rajah, Penang (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 554 days.

(21) Appl. No.: 17/428,721

(22) PCT Filed: Mar. 14, 2019

(86) PCT No.: PCT/EP2019/056434
§ 371 (c)(1),
(2) Date: Aug. 5, 2021

(87) PCT Pub. No.: WO2020/182313
PCT Pub. Date: Sep. 17, 2020

(65) Prior Publication Data
US 2022/0131052 A1     Apr. 28, 2022

(51) Int. Cl.
*H01L 33/50* (2010.01)
*H01L 33/54* (2010.01)
*H01L 33/60* (2010.01)

(52) U.S. Cl.
CPC ............ *H01L 33/505* (2013.01); *H01L 33/54* (2013.01); *H01L 33/60* (2013.01); *H01L 2933/0041* (2013.01); *H01L 2933/0058* (2013.01)

(58) Field of Classification Search
CPC .............. H01L 33/50–508; H01L 2933/0041
See application file for complete search history.

(56) References Cited

U.S. PATENT DOCUMENTS 10,043,953 B2 * 8/2018 Kim ..................... H01L 33/505
2010/0237775 A1   9/2010 Chao
(Continued)

FOREIGN PATENT DOCUMENTS

EP        3511981 A1    7/2019
WO     2018162076 A1    9/2018

*Primary Examiner* — Evren Seven
*Assistant Examiner* — Cole Leon Lindsey
(74) *Attorney, Agent, or Firm* — Slater Matsil, LLP

(57) ABSTRACT

In an embodiment an optoelectronic semiconductor component includes an optoelectronic semiconductor chip having a radiation exit surface and side surfaces running transversely with respect to the radiation exit surface, the optoelectronic semiconductor chip configured to emit primary radiation through the radiation exit surface, a conversion element arranged on the radiation exit surface, the conversion element configured to convert at least part of the primary radiation into secondary radiation and including a stack of at least two conversion layers and a reflective element laterally surrounding the optoelectronic semiconductor chip, wherein a lateral extent of the conversion layers decreases from a layer which is closest to the radiation exit surface to a layer which is most distant from the radiation exit surface, wherein the conversion element includes a part laterally extending beyond the radiation exit surface and being concavely curved, wherein the conversion element is partly arranged on the reflective element, and wherein the conversion element is arranged on a concavely curved surface of the reflective element.

12 Claims, 6 Drawing Sheets

(56) References Cited

U.S. PATENT DOCUMENTS

| | | | |
|---|---|---|---|
| 2011/0018016 A1* | 1/2011 | Bierhuizen | H01L 33/508 |
| | | | 257/E33.068 |
| 2011/0316017 A1 | 12/2011 | Liu et al. | |
| 2013/0062648 A1 | 3/2013 | Nishimura | |
| 2014/0071689 A1* | 3/2014 | Yoon | H01L 33/54 |
| | | | 362/296.01 |
| 2019/0207071 A1* | 7/2019 | Grötsch | H01L 25/0753 |

* cited by examiner

FIG 3

| | Cx | | | Cy | |
|---|---|---|---|---|---|
| α | II | I | α | II | I |
| 92.5 | 0.435697 | 0.37217 | 92.5 | 0.452539 | 0.36384 |
| 87.5 | 0.434874 | 0.3757 | 87.5 | 0.458397 | 0.366702 |
| 82.5 | 0.430675 | 0.3846 | 82.5 | 0.4552 | 0.376237 |
| 77.5 | 0.425482 | 0.39777 | 77.5 | 0.448213 | 0.394566 |
| 72.5 | 0.418417 | 0.39482 | 72.5 | 0.439562 | 0.392723 |
| 67.5 | 0.410741 | 0.38753 | 67.5 | 0.429135 | 0.382649 |
| 62.5 | 0.401895 | 0.38283 | 62.5 | 0.415833 | 0.376705 |
| 57.5 | 0.391623 | 0.38049 | 57.5 | 0.401393 | 0.374137 |
| 52.5 | 0.381626 | 0.37901 | 52.5 | 0.386835 | 0.372218 |
| 47.5 | 0.373242 | 0.37768 | 47.5 | 0.373235 | 0.370754 |
| 42.5 | 0.365711 | 0.37762 | 42.5 | 0.361642 | 0.370522 |
| 37.5 | 0.358602 | 0.37861 | 37.5 | 0.351469 | 0.371689 |
| 32.5 | 0.353268 | 0.37933 | 32.5 | 0.343229 | 0.373148 |
| 27.5 | 0.349228 | 0.38012 | 27.5 | 0.33672 | 0.373666 |
| 22.5 | 0.346441 | 0.38138 | 22.5 | 0.332356 | 0.374631 |
| 17.5 | 0.345072 | 0.38228 | 17.5 | 0.329737 | 0.377378 |
| 12.5 | 0.344622 | 0.38248 | 12.5 | 0.328883 | 0.379786 |
| 7.5 | 0.343975 | 0.38296 | 7.5 | 0.328748 | 0.379465 |
| 2.5 | 0.343374 | 0.38328 | 2.5 | 0.328926 | 0.378272 |

OPTOELECTRONIC SEMICONDUCTOR COMPONENT AND METHOD FOR PRODUCING AN OPTOELECTRONIC SEMICONDUCTOR COMPONENT

This patent application is a national phase filing under section 371 of PCT/EP2019/056434, filed Mar. 14, 2019, of which is incorporated herein by reference in its entirety.

TECHNICAL FIELD

An optoelectronic semiconductor component configured to emit mixed-colored radiation during operation is specified. Furthermore, a method for producing an optoelectronic semiconductor component configured to emit mixed-colored radiation during operation is specified.

BACKGROUND

It is a problem with semiconductor components emitting mixed-colored radiation by means of mixing primary radiation coming from a semiconductor chip and converted secondary radiation coming from a conversion element that the color of the mixed-colored radiation might vary over an angle range. Up to now, this problem is addressed, for example, by means of a diffuser on top of the conversion element to deflect the converted light and encourage mixture of light. However, this leads to a reduction in brightness.

SUMMARY

Embodiments provide an optoelectronic semiconductor component with improved color performance. Further embodiments provide a method for producing an optoelectronic semiconductor component with improved color performance.

In accordance with at least one embodiment, the optoelectronic semiconductor component is configured to emit mixed-colored radiation, which means in particular that the radiation emitted by the optoelectronic semiconductor component during operation comprises portions of radiation of at least two different wavelengths. Especially, the optoelectronic semiconductor component comprises an optoelectronic semiconductor chip configured to emit primary radiation during operation. The primary radiation can be assigned a first (peak) wavelength or a first wavelength range. Advantageously, the first (peak) wavelength or first wavelength range is in the visible range. For example, the optoelectronic semiconductor chip may emit blue primary radiation during operation.

The optoelectronic semiconductor chip has a radiation exit surface and side surfaces running transversely with respect to the radiation exit surface. The side surfaces preferably run perpendicular to the radiation exit surface. Especially, the optoelectronic semiconductor chip is configured to emit primary radiation through the radiation exit surface during operation.

Furthermore, the optoelectronic semiconductor component preferably comprises a conversion element provided for wavelength conversion of at least part of the primary radiation into secondary radiation. The secondary radiation can be assigned a second (peak) wavelength or a second wavelength range, which in particular is greater than the first (peak) wavelength or wavelength range. The conversion element is therefore provided for so-called "down conversion", in which the generation of radiation having a longer wavelength is provoked by radiation having a shorter wavelength.

The conversion element comprises, in particular, at least one or a plurality of conversion substances suitable for wavelength conversion. By way of example, the primary radiation may be at least partly converted into green and/or red and/or yellow light by the conversion element, such that the semiconductor component can emit white light during operation.

According to at least one embodiment, the conversion element is arranged on the radiation exit surface. Thus, primary radiation emitted from the optoelectronic semiconductor chip at the radiation exit surface can enter the conversion element.

In accordance with at least one embodiment, the conversion element comprises a stack of at least two conversion layers, wherein a lateral extent of the conversion layers decreases from the layer which is closest to the radiation exit surface to the layer which is most distant from the radiation exit surface. Within the present application, the "lateral extent" denotes a maximum size in a lateral direction, wherein the lateral direction denotes a direction perpendicular to a main axis of the radiation exit surface. Especially, the lateral extent in all possible lateral directions decreases from the layer which is closest to the radiation exit surface to the layer which is most distant from the radiation exit surface. In other words, a lateral size of the conversion layers decreases from the layer which is closest to the radiation exit surface to the layer which is most distant from the radiation exit surface.

According to a preferred embodiment, the lateral extent decreases gradually from the layer which is closest to the radiation exit surface to the layer which is most distant from the radiation exit surface. In other words, considering two adjacent conversion layers of the conversion element, the one closer to the radiation exit surface has a greater lateral extent than the one further away from the radiation exit surface. Especially, the conversion layer closer to the radiation exit surface laterally projects beyond the one further away from the radiation exit surface on all sides.

According to a preferred variant, the conversion layers have a rectangular shape in plan view of the optoelectronic semiconductor component.

In accordance with at least one embodiment, the conversion element or conversion layers is/are arranged symmetrically with respect to the main axis of the radiation exit surface.

Preferably, the conversion element is formed in the shape of a pyramid or a truncated pyramid, wherein a top or top region of the conversion element is arranged above the radiation exit surface, for example at or symmetrically around the main axis of the radiation exit surface.

The conversion element as described, namely comprising a stack of at least two conversion layers, wherein the lateral extent of the conversion layers decreases from the layer which is closest to the radiation exit surface to the layer which is most distant from the radiation exit surface, particularly comprises an inner region arranged at the main axis of the radiation exit surface and at least one outer region laterally surrounding the inner region, wherein the inner region has a greater vertical extent or thickness than the at least one outer region. Within the present application, the "vertical extent" denotes a maximum size in a vertical direction, which is parallel to the main axis of the radiation exit surface. In particular, the vertical extent of each region correlates to the number of layers contained in the respective region. Especially, the number of layers of two adjacent regions differs by one starting from the inner region up to an outermost region. Moreover, the lateral extent of each region is preferably identical to the lateral extent of a top layer of the respective region. For example, the number of layers may range from 2 to 10, in particular from 4 to 6.

According to a preferred variant, the conversion layers each have a thickness of 10 µm to 15 µm.

The conversion element having the greatest vertical extent at or around the main axis of the radiation exit surface has the advantage that more radiation can be converted around the center of the optoelectronic semiconductor component than at edges of the optoelectronic semiconductor component. This is especially advantageous because within the optoelectronic semiconductor component described here a radiation distribution of the radiation emitted by the optoelectronic semiconductor chip is such that a majority of radiation is emitted towards the main axis of the radiation exit surface. So, by way of a conversion element having a greater vertical extent at or around the main axis of the radiation exit surface than at the edges, a conversion degree can be achieved which is higher at or around the main axis of the radiation exit surface than at the edges, and a ratio of the primary to the secondary radiation in the mixed-colored radiation can be essentially equalized over a wide angle range. This results in an improved color-over-angle characteristic of the optoelectronic semiconductor component. The color-over-angle characteristic relates to the variation of the color of the mixed-colored radiation seen from edge to edge across the entire optoelectronic semiconductor component. So, the variation of the color of the mixed-colored radiation over a determined angle range can be reduced with the optoelectronic semiconductor component as described here by means of the conversion element. And in addition it is possible to achieve a better brightness in comparison to a component using a diffusor because fewer radiation losses may occur without a diffusor.

In accordance with at least one embodiment, the conversion element comprises a part which laterally extends beyond the radiation exit surface. In particular, the conversion element laterally projects beyond the optoelectronic semiconductor chip on all sides thereof. This has the advantage that radiation portions which are emitted in directions more or less deviating from the main axis of the radiation exit surface may also enter the conversion element and be converted. Especially, the part which laterally extends beyond the radiation exit surface is concavely curved. This helps achieve an even distribution of radiation over a large angle range of the radiation emitted by the optoelectronic semiconductor component.

In accordance with at least one embodiment, the conversion layers are formed from the same conversion material. This has the effect that all conversion layers convert the primary radiation to the same secondary radiation, that is to say to secondary radiation having the same peak wavelength or wavelength range.

In accordance with at least one embodiment, the optoelectronic semiconductor component comprises a reflective element which laterally surrounds the optoelectronic semiconductor chip. Especially, all side surfaces of the optoelectronic semiconductor chip are covered by the reflective element. All side surfaces may be completely covered by the reflective element. The reflective element can contain or consist of a diffusely reflective material such as TiO2 or aluminium. However, it is also possible for the reflective element to contain a highly reflective material such as silver, for example. The reflective element helps achieve the above described radiation distribution, wherein a majority of the radiation emitted by the semiconductor chip is emitted towards the main axis of the radiation exit surface.

According to a preferred embodiment, the conversion element is partly arranged on the reflective element. In particular, the part of the conversion element which laterally extends beyond the radiation exit surface is arranged on the reflective element.

In accordance with an advantageous variant, the reflective element comprises a concavely curved surface facing the conversion element or the part of the conversion element which laterally extends beyond the radiation exit surface. In other words, the conversion element is arranged on a concavely curved surface of the reflective element. Thus, the concavely curved part of the conversion element can be simply realized by applying the conversion element in a form-fitting manner to the concavely curved surface of the reflective element.

According to at least one embodiment, the optoelectronic semiconductor component comprises a carrier, on which the semiconductor chip is arranged. Moreover, the reflective element, which in particular is not a self-supportive element, is also arranged on the carrier.

The carrier may comprise a carrier body and a first and a second contact structure with a contact region of the first and the second contact structure respectively being arranged on a front surface of the carrier body facing the semiconductor chip and on opposite sides of the semiconductor chip with a respective interspace inbetween. Especially, the reflective element fills the respective interspace between the semiconductor chip and the first and second contact structures or contact regions. Preferably, the reflective element covers all areas of the carrier which might absorb the impinging radiation and therefore might increase radiation losses.

Moreover, the first and the second contact structure may each comprise a contact region arranged on a back surface of the carrier body facing away from the semiconductor chip as well as a contact region extending through the carrier body in the vertical direction and connecting the front side contact region to the back side contact region. This arrangement of the first and second contact structures allows the semiconductor chip to be electrically connected at the front side of the carrier, whereas the semiconductor component can be electrically connected at the back side of the carrier.

The first and second contact structures may be formed from a metal or metal compound, whereas the carrier body may be formed from a semiconductor or ceramic material.

In accordance with a preferred variant, the carrier comprises a mounting structure, where the semiconductor chip is attached to the carrier, for example by means of a solder or adhesive bond. The mounting structure may extend from the front surface of the carrier body through the carrier body up to the back surface of the carrier body. In particular, the mounting structure is thermally conductive and helps dissipate heat from the semiconductor chip. Suitable materials for the mounting structure are metals or metal compounds such as copper or compounds of copper, for example.

In accordance with at least one embodiment, the optoelectronic semiconductor component comprises an encapsulant covering the conversion element. Especially, the encapsulant completely covers the front surface of the carrier. The encapsulant may have a dome-like shape and may function as a lens concentrating the mixed-colored radiation in a preferred direction. Preferably, the main axis of the radiation exit surface is an axis of symmetry of the encapsulant.

In accordance with at least one embodiment, the optoelectronic semiconductor chip comprises a semiconductor layer sequence which has an active layer suitable for generating primary radiation, and a first and a second electrical connecting layer, wherein the semiconductor chip is provided for emitting electromagnetic radiation from a front side, and the first and the second electrical connecting layer are arranged at a rear side opposite the front side and are electrically insulated from one another by means of a separating layer, wherein the first electrical connecting layer, the second electrical connecting layer and the separating layer overlap laterally, and a partial region of the second electrical connecting layer extends from the rear side through a breakthrough in the active layer in the direction of the front side. In particular, the first electrical connecting layer and the second electrical connecting layer each have an electrical contact area which is suitable for electrically contacting the semiconductor chip from its front side. The electrical contact areas can be electrically connected with the respective contact structure, for example by means of a wire bond.

The active zone can comprise a pn junction, a double hetero structure, a single quantum well structure (SQW structure) or a multi quantum well structure (MQW structure).

Besides the active zone, the semiconductor layer sequence can comprise further functional layers and functional regions, for instance p- or n-doped charge carrier transport layers, undoped or p- or n-doped confinement, cladding or waveguide layers, barrier layers, planarization layers, buffer layers, protective layers and combinations thereof. The semiconductor layer sequence can be grown on a growth substrate by means of an epitaxy method, for example by means of metal organic vapor phase epitaxy (MOVPE) or molecular beam epitaxy (MBE). The semiconductor layer sequence can be formed for example from a material on the basis of $In_xGa_yAl_{1-x-y}N$, wherein in each case $0 \leq x \leq 1$ and $0 \leq y \leq 1$ hold true. In this case, the semiconductor layer sequence is suitable for emitting short-wave visible, in particular from green to blue, primary radiation.

The optoelectronic semiconductor chip may be a thin-film chip which is free of a growth substrate or where the growth substrate is at least thinned.

Hereinafter, a method is described which is suitable for producing an optoelectronic semiconductor component as described above. Features described in connection with the optoelectronic semiconductor component can therefore also be relied on for the method and vice versa.

In accordance with at least one embodiment of a method for producing an optoelectronic semiconductor component configured to emit mixed-colored radiation during operation, in one step an optoelectronic semiconductor chip is provided having a radiation exit surface and at least one side surface running transversely with respect to the radiation exit surface, said semiconductor chip being configured to emit primary radiation through the radiation exit surface during operation. In another step, a conversion material is applied layer after layer to the radiation exit surface for forming a conversion element comprising at least two conversion layers, wherein a lateral extent of the conversion layers decreases from the layer which is closest to the radiation exit surface to the layer which is most distant from the radiation exit surface.

According to a preferred embodiment of the method, the conversion material is applied to the radiation exit surface by means of spray coating. Preferably, the conversion material is formed from a spraying medium containing a matrix material and converter particles. In particular, the matrix material already surrounds the converter particles in the spraying medium. The converter particles are for example distributed in the matrix material and surrounded by the matrix material on all sides. By way of example, a resin-based or silicone-containing matrix material can be used.

In accordance with at least one embodiment of the method, the spraying medium is sprayed onto the semiconductor chip from a nozzle of a spraying device. By way of example, a first spraying burst can be produced for producing a first layer. A second spraying burst can be produced for producing a second layer. A pause can be interposed between the spraying bursts, wherein the spraying medium can solidify to form a conversion layer in the pause. The conversion layers of different lateral extents may be produced by masks having different sizes of mask openings. Especially, the process starts with a mask having the greatest mask opening and continues with masks whose mask openings are gradually reduced from layer to layer. This method is advantageous because the required masks are inexpensive, and the different masks are easy to handle in process.

According to a preferred variant of the method, a reflective element is formed from a reflective material such as $TiO2$ or aluminium to laterally surround the optoelectronic semiconductor chip.

In accordance with at least one embodiment of the method, an encapsulant is molded to cover the conversion element. The encapsulant can be formed from a molding compound. In particular, the molding compound is applied in a form-fitting manner to the semiconductor chip provided with the conversion element and the reflective element. The encapsulant may be formed dome-like from a translucent material such as silicone or an epoxy.

BRIEF DESCRIPTION OF THE DRAWINGS

Further advantages, preferred embodiments and developments of the optoelectronic semiconductor component will become apparent from the exemplary embodiments described below in association with FIGS. 1 to 6.

FIG. 3 shows a table with simulated values of a color over angle of mixed-colored radiation from an optoelectronic semiconductor component according to embodiments I and II;

DETAILED DESCRIPTION OF ILLUSTRATIVE EMBODIMENTS

Figure 1A:
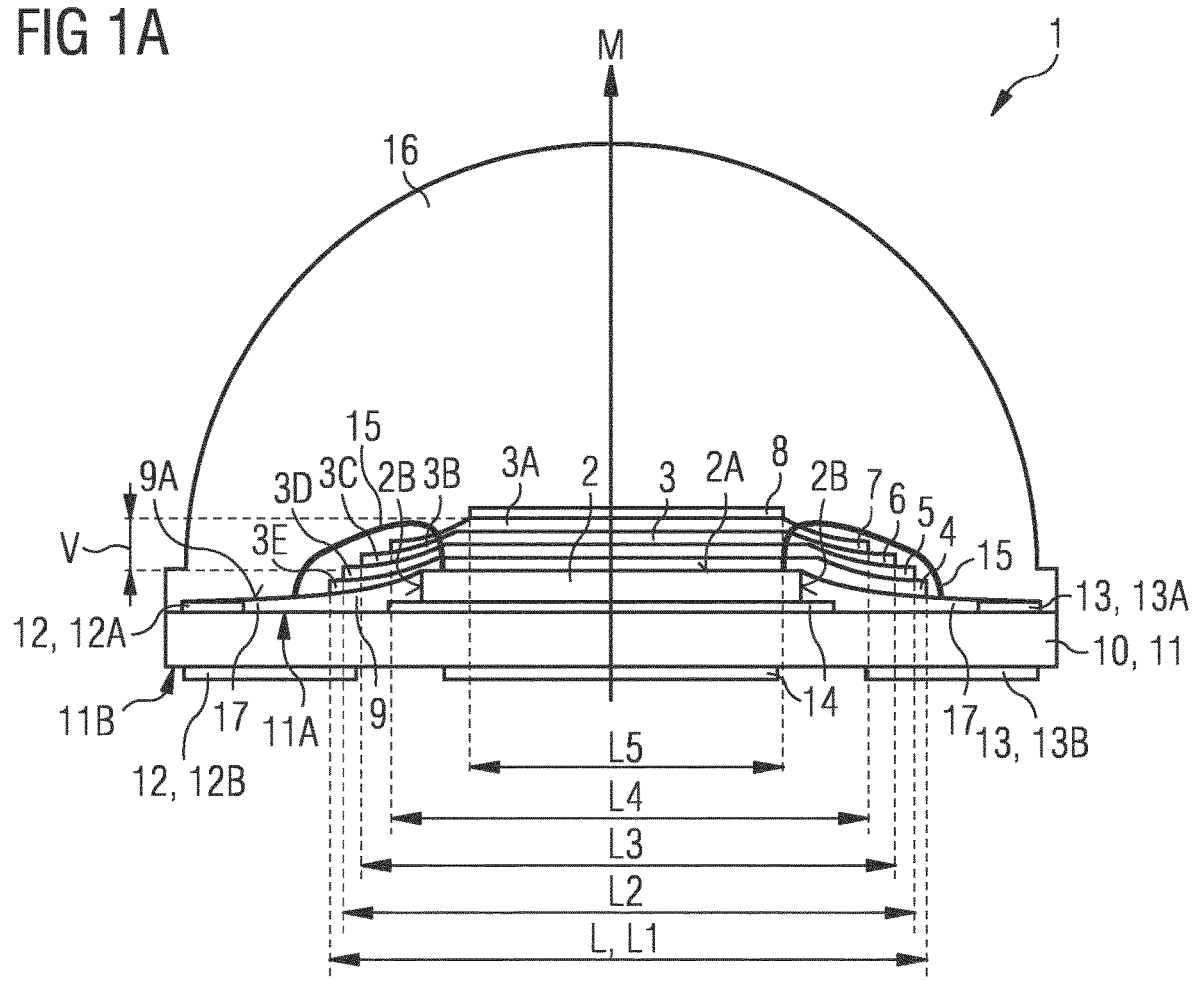
FIG. 1A shows a schematic cross-sectional view.
Figure 1B:
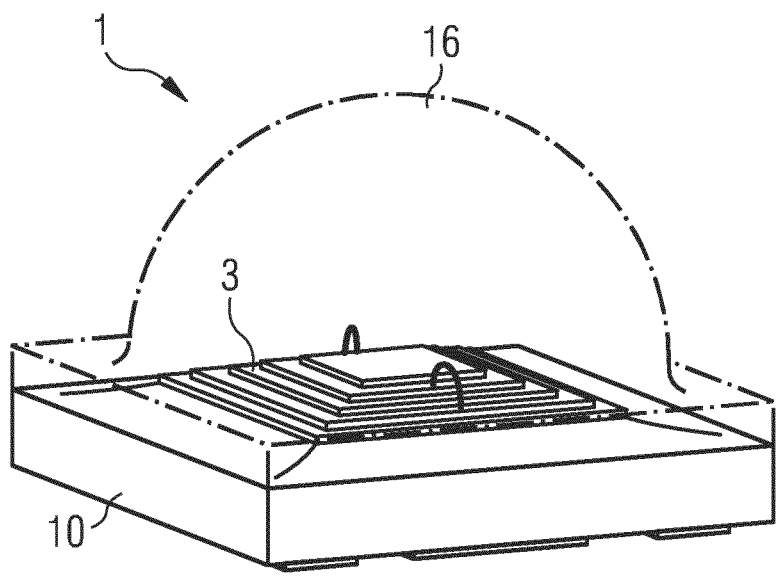
FIG. 1B shows a schematic perspective view and FIG. 1C shows a side view of an exemplary embodiment I of an optoelectronic semiconductor component.
Figure 1C:
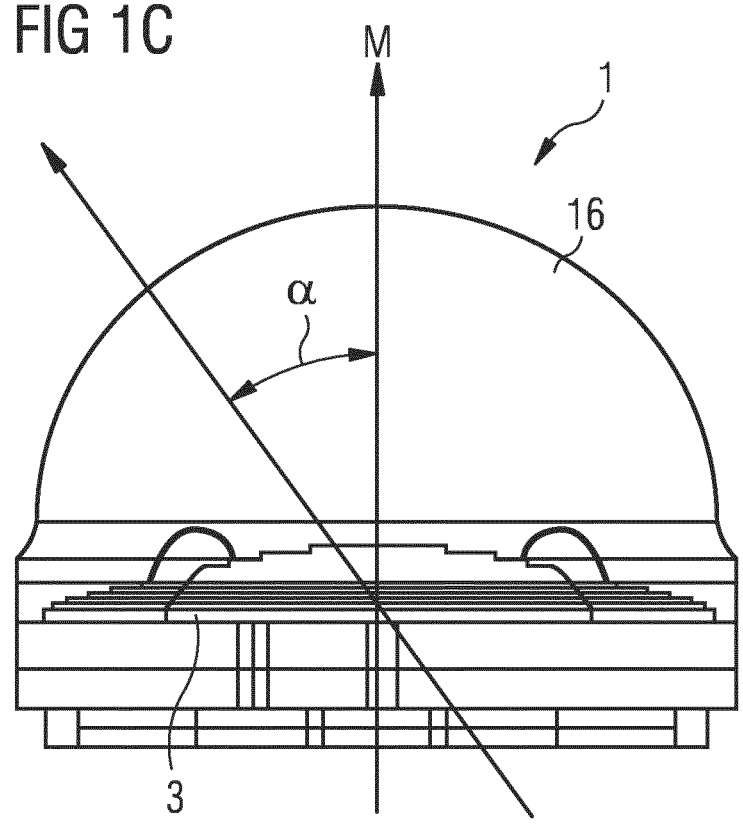

FIGS. 1A, 1B and 1C show an exemplary embodiment I of an optoelectronic semiconductor component 1. The optoelectronic semiconductor component 1 comprises an optoelectronic semiconductor chip 2 and a carrier 10, on which the optoelectronic semiconductor chip 2 is arranged. The optoelectronic semiconductor chip 2 has a radiation exit surface 2A and side surfaces 2B running transverse, preferably perpendicular, with respect to the radiation exit surface 2A. A main axis M of the radiation exit surface 2A runs through a center of the radiation exit surface 2A and preferably is an axis of symmetry of the optoelectronic semiconductor chip 2 and the optoelectronic semiconductor component 1.

Furthermore, the semiconductor component 1 comprises a conversion element 3 arranged on the semiconductor chip 2 and laterally projecting beyond the semiconductor chip 2. Moreover, the semiconductor component 1 comprises a reflective element 9 laterally surrounding the optoelectronic semiconductor chip 2 and supporting the laterally projecting part of the conversion element 3. Especially, all side surfaces 2B of the optoelectronic semiconductor chip 2 are covered, at least partly, preferably completely, by the reflective element 9. The semiconductor component 1 further comprises a dome-like encapsulant 16 spanning the carrier 10 and especially covering the conversion element 3.

The conversion element 3 comprises a stack of several conversion layers 4, 5, 6, 7, 8 with different lateral extents L1, L2, L3, L4, L5. Here, the lateral extent L decreases from a first layer 4 which is closest to the radiation exit surface 2A to a last layer 8 which is most distant from the radiation exit surface 2A. Especially, the lateral extent L in all possible lateral directions decreases from the first layer 4 to the last layer 8 (see FIG. 1B). In other words, a lateral size of the conversion layers 4, 5, 6, 7, 8 decreases from the first layer 4 to the last layer 8, and the conversion layer closer to the radiation exit surface 2A laterally projects beyond the one further away from the radiation exit surface 2A on all sides.

In particular, the lateral extent L decreases gradually from the first layer 4 to the last layer 8. In other words, considering two adjacent conversion layers of the conversion element 3, the one closer to the radiation exit surface 2A has a greater lateral extent L than the one further away from the radiation exit surface 2A.

The conversion element 3 or conversion layers 4, 5, 6, 7, 8 is/are arranged symmetrically with respect to the main axis M of the radiation exit surface 2A. The conversion layers 4, 5, 6, 7, 8 have a rectangular, preferably square shape in plan view of the optoelectronic semiconductor component 1. And the stack of layers 4, 5, 6, 7, 8 or the conversion element 3 may follow the shape of a pyramid or a truncated pyramid (see FIG. 1B).

By means of the conversion layers 4, 5, 6, 7, 8, whose lateral extent L decreases from the first to the last layer 4, 8, the conversion element 3 comprises an inner region 3A arranged at the main axis M of the radiation exit surface 2A and several outer regions 3B, 3C, 3D, 3E laterally surrounding the inner region 3A, wherein the inner region 3A has a greater vertical extent V or thickness than the outer regions 3B, 3C, 3D, 3E. In particular, the vertical extent V of each region 3A, 3B, 3C, 3D, 3E correlates to the number of layers contained in the respective region. Moreover, the lateral extent L of each region 3A, 3B, 3C, 3D, 3E is identical to the lateral extent L of a top layer of the respective region.

In order to produce the conversion element 3, a conversion material is applied layer after layer to the radiation exit surface 2A, in particular by means of spray coating. By way of example, a first spraying burst can be produced for producing the first layer 4. A second spraying burst can be produced for producing the second layer 5 and so on. A pause can be interposed between the spraying bursts, wherein a spraying medium used can solidify to form a conversion layer in the pause. The conversion layers 4, 5, 6, 7, 8 of different lateral extents L are produced by masks having different sizes of mask openings, wherein the spraying medium is sprayed into the mask openings. Especially, the process starts with a mask having the greatest mask opening in order to produce the first layer 4 and continues with masks whose mask openings are gradually reduced from layer to layer.

Preferably, the conversion layers 4, 5, 6, 7, 8 are formed from the same conversion material. This has the effect that all conversion layers 4, 5, 6, 7, 8 convert the primary radiation to the same secondary radiation. Furthermore, the conversion layers 4, 5, 6, 7, 8 are preferably formed with the same thickness V. For example, the conversion layers 4, 5, 6, 7, 8 can each have a thickness of 10 μm to 15 μm.

The reflective element 9 contains or consists of a diffusely reflective material such as $TiO_2$ or aluminium. Moreover, the reflective element 9 comprises a concavely curved surface 9A, where a part of the conversion element 3 is arranged in a form-fitting manner and thus is also concavely curved. This helps achieve an even distribution of radiation over a large angle range of the radiation emitted by the optoelectronic semiconductor component 1.

The carrier 10 comprises a carrier body 11 and a first and a second contact structure 12, 13 with a contact region 12A, 13A of the first and the second contact structure 12, 13 respectively being arranged on a front surface 11A of the carrier body 11. Moreover, the first and the second contact structure 12, 13 each comprise a contact region 12B, 13B arranged on a back surface 11B of the carrier body 11 as well as a contact region extending through the carrier body 11 in a vertical direction and connecting the front side contact region 12A, 13A to the back side contact region 12B, 13B. This arrangement of the first and second contact structures 12, 13 allows the semiconductor chip 2 to be electrically connected at the front side of the carrier 10, whereas the semiconductor component 1 can be electrically connected at the back side of the carrier 10.

The first and second contact structures 12, 13 may be formed from a metal or metal compound, whereas the carrier body 11 may be formed from a semiconductor or ceramic material.

Moreover, the carrier 10 comprises a mounting structure 14, where the semiconductor chip 2 is attached to the carrier 10, for example by means of a solder or adhesive bond. The mounting structure 14 extends from the front surface 11A of the carrier body 11 through the carrier body 11 up to the back surface 11B of the carrier body 11. Advantageously, the mounting structure 14 is thermally conductive and helps dissipate heat from the semiconductor chip 2. Suitable materials for the mounting structure 14 are metals or metal compounds such as copper or compounds of copper, for example.

The optoelectronic semiconductor chip 2 arranged on the carrier 10 comprises a semiconductor layer sequence (not shown) which has an active layer suitable for generating primary radiation, and a first and a second electrical connecting layer (not shown), wherein the first and the second electrical connecting layer are arranged at a rear side opposite the front side and are electrically insulated from one another by means of a separating layer, wherein the first electrical connecting layer, the second electrical connecting layer and the separating layer overlap laterally, and a partial region of the second electrical connecting layer extends from the rear side through a breakthrough in the active layer in the direction of the front side. In particular, the first electrical connecting layer and the second electrical connecting layer each have an electrical contact area which is suitable for electrically contacting the semiconductor chip 1 from its front side. Here, the electrical contact areas are electrically connected with the respective contact structure 12, 13 by means of a wire bond 15.

The reflective element 9 fills interspaces 17 between the semiconductor chip 2 and the first and second contact structures 12, 13. This helps reduce radiation losses because the impinging radiation can be reflected versus a radiation emitting side of the semiconductor component 1.

The encapsulant 16 can be formed from a molding compound. In particular, the molding compound is applied in a form-fitting manner to the semiconductor chip 2 provided with the conversion element 3 and the reflective element 9. The encapsulant 16 may be formed dome-like from a translucent material such as silicone or an epoxy.

During operation, the semiconductor component 1 emits mixed-colored radiation, which means in particular that the mixed-colored radiation comprises portions of radiation of at least two different wavelengths such as a primary and a secondary radiation.

Especially, the optoelectronic semiconductor chip 2 emits primary radiation, wherein a first (peak) wavelength or a first wavelength range can be assigned to the primary radiation. The first (peak) wavelength or first wavelength range preferably is in the visible range. For example, the optoelectronic semiconductor chip 2 emits blue primary radiation. Furthermore, the conversion element 3 converts at least part of the primary radiation into secondary radiation. The secondary radiation can be assigned a second wavelength range or a second (peak) wavelength, which in particular is greater than the first (peak) wavelength or wavelength range.

The conversion element comprises, in particular, at least one or a plurality of conversion substances suitable for wavelength conversion. By way of example, the primary radiation may be at least partly converted into green and/or red and/or yellow light by the conversion element, such that the semiconductor component 1 emits white light.

The optoelectronic semiconductor chip 2 emits primary radiation through the radiation exit surface 2A, and as the conversion element 3 is arranged on the radiation exit surface 2A, primary radiation emitted from the optoelectronic semiconductor chip 2 can easily enter the conversion element 3. Here, a radiation distribution of the primary radiation emitted by the optoelectronic semiconductor chip 2 is such that a majority of the radiation is emitted towards the main axis M of the radiation exit surface 2A. Advantageously, the reflective element 9 helps achieve this radiation distribution because radiation coming from the semiconductor chip 2 and impinging on the reflective element 9 is reflected towards the radiation exit surface 2A.

By means of the conversion element 3, which has a greater vertical extent Vat or around the main axis M of the radiation exit surface 2A than at its edges, a conversion degree can be achieved which is higher at or around the main axis M of the radiation exit surface 2A than at the edges so that a ratio of the primary to the secondary radiation in the mixed-colored radiation can be essentially equalized over a wide angle range. This results in an improved color-over-angle characteristic of the optoelectronic semiconductor component 1. The color-over-angle characteristic is described in more detail in connection with the following Figures.

Figure 2A:
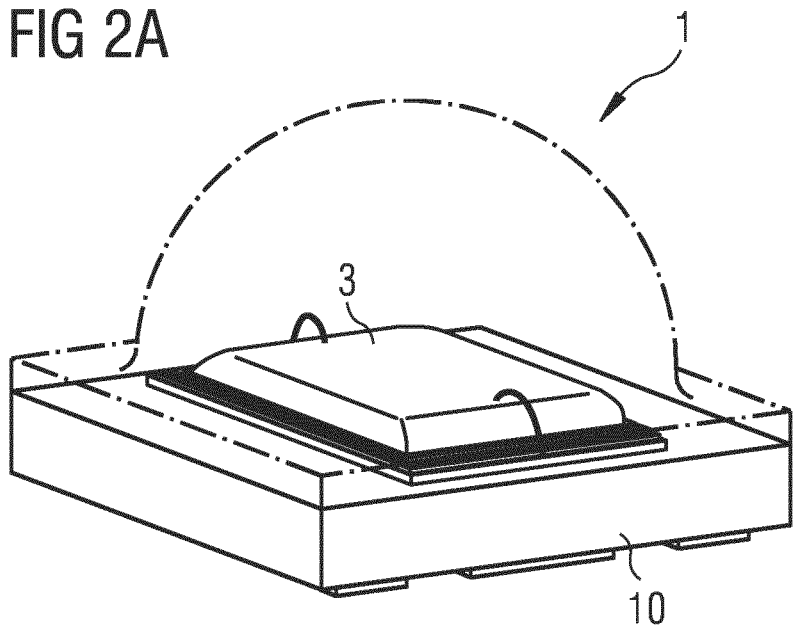
FIG. 2A shows a schematic perspective view and FIG. 2B shows a side view of a comparative embodiment II of an optoelectronic semiconductor component.
Figure 2B:
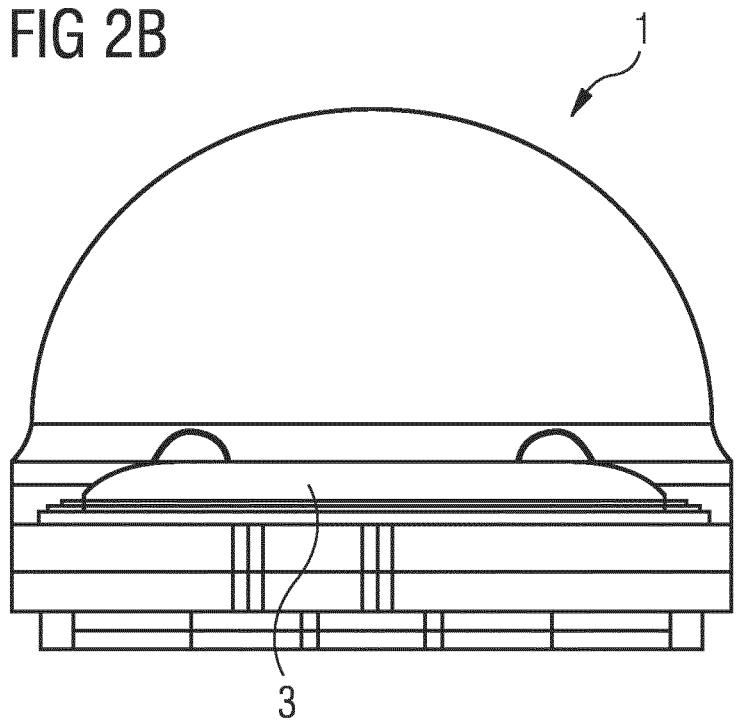

FIGS. 2A and 2B show a comparative example of an optoelectronic semiconductor component 1, which in contrast to the optoelectronic semiconductor component 1 described herein comprises a conversion element 3 having a single conversion layer.

FIGS. 3 to 6 show simulation results based on the embodiment I according to FIGS. 1A to 1C and to the embodiment II according to FIGS. 2A and 2B.

FIG. 3 shows a table wherein a color of the mixed-colored radiation emitted by a semiconductor component according to embodiment I and embodiment II is specified for different angles α.

Angle α denotes the emission angle of the mixed-colored radiation with respect to the main axis M, wherein mixed-colored radiation emitted at the main axis M has an angle of 0°. The unit of angle α is degree (°).

The color can be specified by chromaticity coordinates, such as the Cx, Cy coordinates on the CIE 1931 chromaticity diagram. For example, the mixed-colored radiation emitted at α=0° has a white color, wherein the chromaticity coordinates of white color are Cx=Cy=⅓.

The first three columns of the table relate to the Cx-coordinate denoted "Cx". The first column denotes angle α, the second column denotes the color coordinate Cx for embodiment II, and the third column denotes the color coordinate Cx for embodiment I.

Moreover, the last three columns of the table relate to the Cy-coordinate denoted "Cy". The first column thereof denotes angle α, the second column denotes the color coordinate Cy for embodiment II, and the third column denotes the color coordinate Cy for embodiment I.

Figure 4:
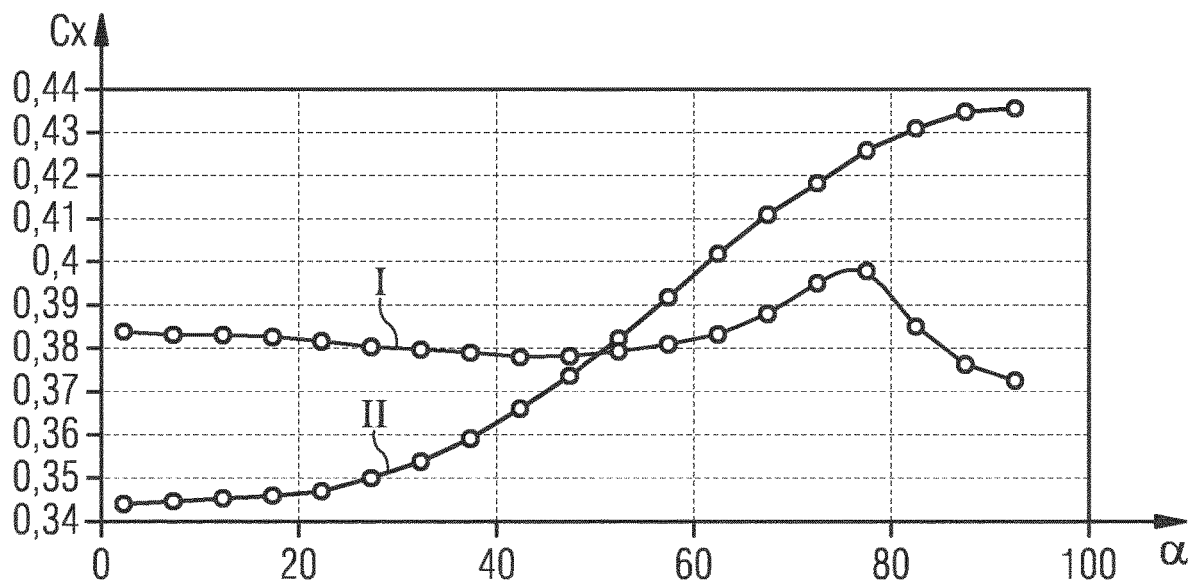
FIGS. 4 and 5 show graphs of the color values according to the table of FIG. 3.

FIG. 4 shows a graph I of embodiment I and a graph II of embodiment II illustrating the color coordinate Cx over angle α specified in degrees.

Figure 5:
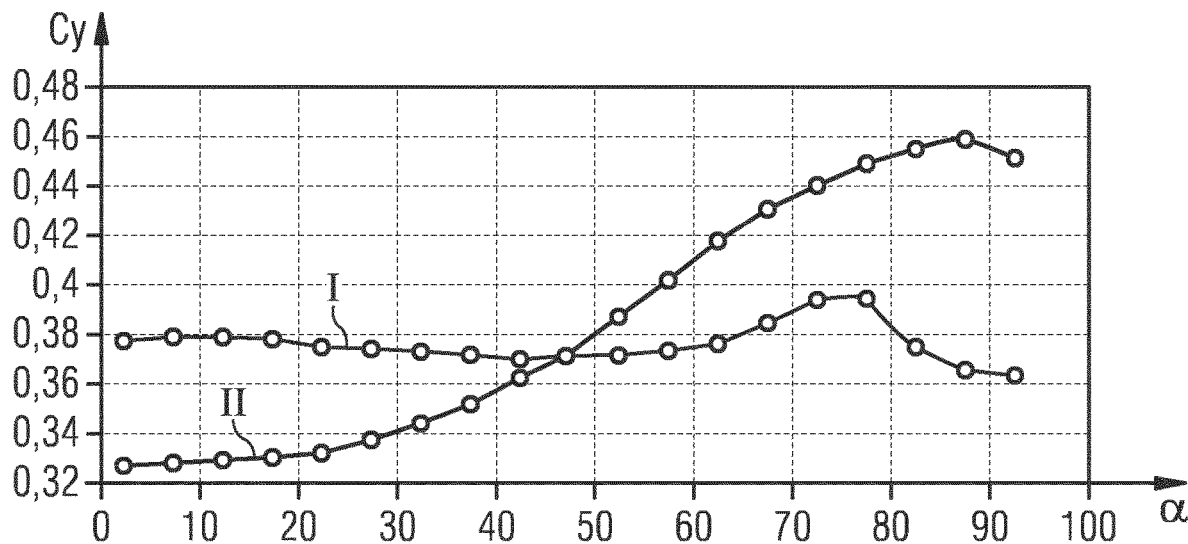

FIG. 5 shows a graph I of embodiment I and a graph II of embodiment II illustrating the color coordinate Cy over angle α specified in degrees.

As becomes evident from the table and the graphs of FIGS. 4 and 5, the color deviation for embodiment II within a range of angles of 0°≤α≤90° is about 0.1 for both color coordinates Cx and Cy. However, the color deviation for embodiment I within the range of angles of 0°≤α≤90° is only about 0.02 for both color coordinates Cx and Cy. Thus, an improvement of 80% of the color-over-angle variation can be achieved with embodiment I in comparison to embodiment II.

In summary, the variation of the color of the mixed-colored radiation over a determined angle range can be reduced with the optoelectronic semiconductor component as described here by means of the conversion element.

Figure 6:
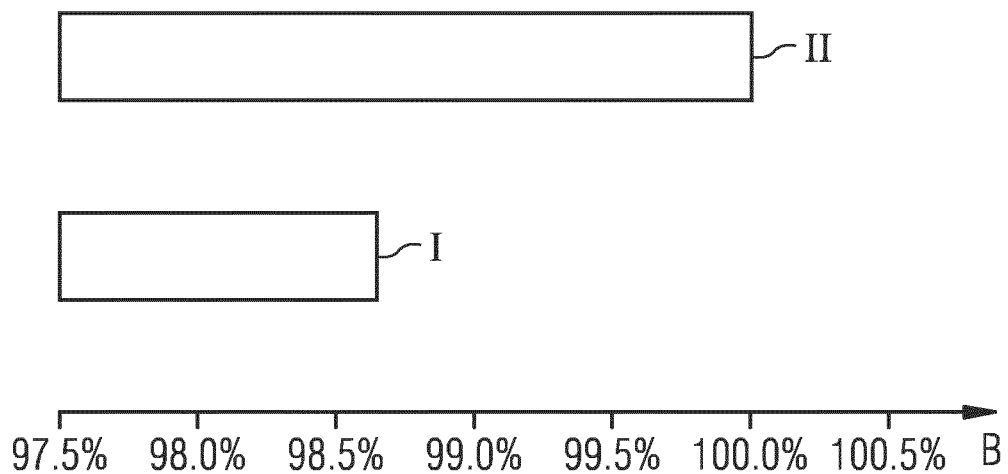
FIG. 6 shows a bar graph illustrating a simulated brightness of an optoelectronic semiconductor component according to embodiments I and II.

FIG. 6 shows a simulated brightness B of mixed-colored radiation emitted by an optoelectronic semiconductor component according to embodiment I (graph I) in relation to embodiment II (graph II) at a color temperature of 5000 K and with a color-rendering index of 70.

As becomes evident from FIG. 6, the brightness loss with embodiment I comprising more conversion layers than embodiment II is only about 1.4%. However, if the conversion element uses a diffuser, the brightness loss is about 6%.

In summary, in addition to an improved color-over-angle characteristic, it is possible to achieve a better brightness with the optoelectronic semiconductor component as described above in comparison to a component using a diffusor as a means for improving the color-over-angle characteristic.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor component comprising:
    an optoelectronic semiconductor chip having a radiation exit surface and side surfaces running transversely with respect to the radiation exit surface, the optoelectronic semiconductor chip configured to emit primary radiation through the radiation exit surface;
    a conversion element arranged on the radiation exit surface, the conversion element configured to convert at least part of the primary radiation into secondary radiation and comprising a stack of at least two conversion layers; and
    a reflective element laterally surrounding the optoelectronic semiconductor chip,
    wherein a lateral extent of the conversion layers decreases from a layer which is closest to the radiation exit surface to a layer which is most distant from the radiation exit surface,
    wherein the conversion element comprises a part, which laterally extends beyond the radiation exit surface, is concavely curved, and comprises more than one of the at least two conversion layers,
    wherein the conversion element is partly arranged on the reflective element,
    wherein the conversion element is arranged on a concavely curved surface of the reflective element, and
    wherein the optoelectronic semiconductor component is configured to emit mixed-colored radiation.

2. The optoelectronic semiconductor component according to claim 1, wherein the conversion layers are formed from the same conversion material.

3. The optoelectronic semiconductor component according to claim 1, wherein the conversion layers have a rectangular shape in plan view of the optoelectronic semiconductor component.

4. The optoelectronic semiconductor component according to claim 1, wherein the conversion layers are symmetrically arranged with respect to a main axis of the radiation exit surface.

5. The optoelectronic semiconductor component according to claim 1, further comprising a carrier on which the optoelectronic semiconductor chip is arranged, wherein the carrier comprises a first and a second contact structure, and wherein the reflective element fills a respective interspace between the optoelectronic semiconductor chip and the first and second contact structures.

6. The optoelectronic semiconductor component according to claim 1, wherein each of the conversion layers has a thickness of 10 μm to 15 μm.

7. The optoelectronic semiconductor component according to claim 1, further comprising a dome-like encapsulant covering the conversion element.

8. A method for producing an optoelectronic semiconductor component, the method comprising:
    providing an optoelectronic semiconductor chip having a radiation exit surface and at least one side surface running transversely with respect to the radiation exit surface, the optoelectronic semiconductor chip configured to emit primary radiation through the radiation exit surface;
    forming a reflective element to laterally surround the optoelectronic semiconductor chip; and
    applying a conversion material layer after layer to the radiation exit surface for forming a conversion element comprising at least two conversion layers,
    wherein a lateral extent of the conversion layers decreases from a layer which is closest to the radiation exit surface to a layer which is most distant from the radiation exit surface,
    wherein the conversion element comprises a part, which laterally extends beyond the radiation exit surface, is concavely curved, and comprises more than one of the at least two conversion layers,
    wherein the conversion element is partly arranged on the reflective element, and
    wherein the conversion element is arranged on a concavely curved surface of the reflective element.

9. The method according to claim 8, wherein applying the conversion material layer comprises spray coating the conversion material layer.

10. The method according to claim 8, wherein the conversion layers are produced by masks having different sizes of mask openings.

11. The method according to claim 8, wherein the reflective element is formed from a reflective material.

12. An optoelectronic semiconductor component comprising:
    an optoelectronic semiconductor chip having a radiation exit surface and side surfaces running transversely with respect to the radiation exit surface, the optoelectronic semiconductor chip configured to emit primary radiation through the radiation exit surface;
    a conversion element arranged on the radiation exit surface, the conversion element configured to convert at least part of the primary radiation into secondary radiation and comprising a stack of at least two conversion layers; and
    a reflective element laterally surrounding the optoelectronic semiconductor chip,
    wherein a lateral extent of the conversion layers decreases from a layer which is closest to the radiation exit surface to a layer which is most distant from the radiation exit surface,
    wherein the conversion element comprises a part, which laterally extends beyond the radiation exit surface, is concavely curved, and comprises more than one of the at least two conversion layers,
    wherein the conversion element is partly arranged on the reflective element,
    wherein the conversion element is arranged on a concavely curved surface of the reflective element,
    wherein each of the conversion layers of the conversion element is continuous and at least one of the conversion layers of the conversion element comprises a lateral extent smaller than a lateral extent of the radiation exit surface of the optoelectronic semiconductor chip, and
    wherein the optoelectronic semiconductor component is configured to emit mixed-colored radiation.

* * * * *